Jan. 30, 1968 L. ESAKI ET AL 3,366,518

HIGH SENSITIVITY DIODES

Filed July 1, 1964

INVENTORS

LEO ESAKI
ROBERT A. LAFF

BY John F. Ohlandt, Jr.

ATTORNEY

3,366,518
HIGH SENSITIVITY DIODES

Leo Esaki, Chappaqua, and Robert A. Laff, Yorktown Heights, N.Y., assignors to International Business Machines Corporation, New York, N.Y., a corporation of New York Filed July 1, 1964, Ser. No. 379,615
3 Claims. (Cl. 148—177)

ABSTRACT OF THE DISCLOSURE

A PbTe diode exhibiting good rectification characteristics and wherein the p region has an acceptor concentration in the range of approximately $10^{17}$–$10^{18}$ carriers/cc. and wherein the n region is formed by alloying an n-type determining impurity material at a temperature less than 400 C.

The material PbTe has been investigated before and the magneto-tunneling in this material has been described in an article by R. H. Rediker and A. R. Calawa, "Magnetotunneling in Lead Telluride," Journal of Applied Physics, vol. 32, No. 10, October 1961. This article described studies that were made of the effects on the tunneling current of PbTe tunnel diodes with applications of magnetic fields up to 88000 gauss. From these and other studies, it has generally been expected that desirable rectification properties would require the use of extremely low temperatures.

It has been found, however, that by the use of proper procedures PbTe diodes comprising pn junctions can be devised which will exhibit extremely useful characteristics, as described hereinafter, at room temperature. Such a room temperature PbTe diode is considered to be one of the lowest potential barrier diodes ever made.

PbTe is one of the so called narrow-gap semiconductors and in this respect is similar to InSb. PbTe has an energy gap of approximately 0.18 $q\bar{V}$ at 0° K. and approximately 0.30 $q\bar{V}$ at 300° K. As noted above, it has been possible to make junction devices of such materials but these have been usable only at low temperatures, for instance, at liquid nitrogen temperature, but not at room temperature.

Accordingly, it is a primary object of the invention to provide an extremely high sensitivity diode.

Another object is to provide a PbTe diode comprising a pn junction which possesses extremely good rectification characteristics.

A further object is to provide a PbTe diode having a low acceptor concentration so as to exhibit good rectification characteristics at room temperature.

The foregoing and other objects, features and advantages of the invention will be apparent from the following more particular description of preferred embodiments of the invention as illustrated in the accompanying drawings.

Figure 1:
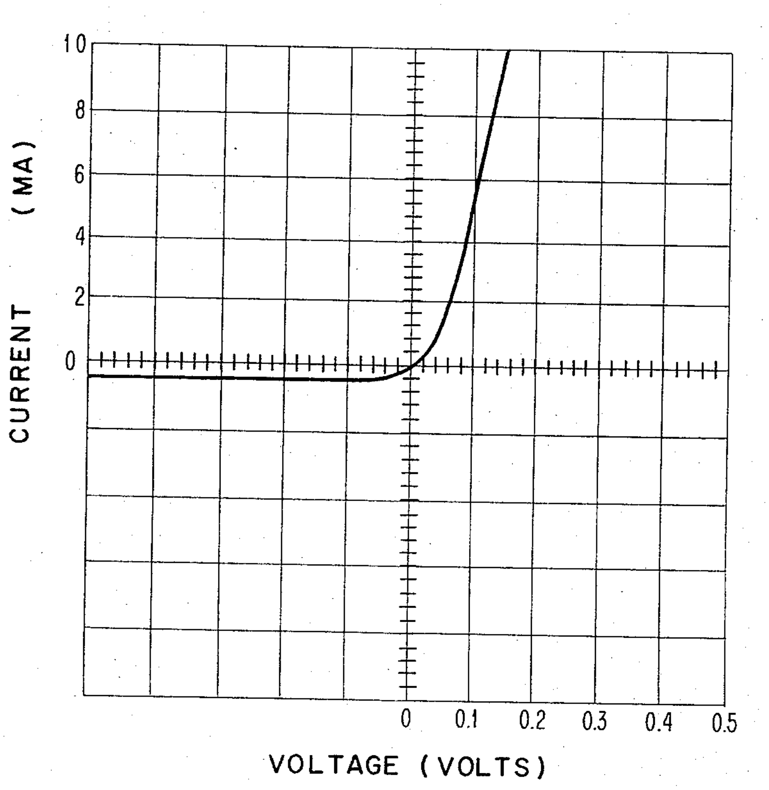
FIGURE 1 is a graph of the current-voltage characteristic of a PbTe diode in accordance with the present invention taken at room temperature. The abscissa and the ordinate are 0.1 volt/division and 2 milliamps/division, respectively.

Referring now to FIGURE 1, wherein the current-voltage characteristic is portrayed, it will be seen that the low voltage backward (reverse biased) characteristic of a PbTe diode in accordance with this invention follows quite well the conventional formula $$I=I_s\left(epx\left(\frac{q\bar{V}}{kT}\right)-1\right)$$

where $I_s$ is the saturation current. The saturation current is proportional to $$exp\left(\frac{q\,\phi}{kT}\right)$$

where $\phi$ is the potential barrier of the pn junction. The saturation current density, which is in the order of 10 amps/cm.$^2$ at room temperature, is unusually large because of the low barrier potential of approximately 0.10–0.15 volt, only several times as much as $kT/q$ which is approximately 0.026 volt.

From the electrical engineering view point, that is, from the device application view point, some significant features of the diodes are: an extremely high conductance in the forward direction (no apparent diffusion potential); a usable non-linear resistance at high bias; and a large saturation current and a high differential resistance in the backward direction. For instance, when the junction area is $3\times10^{-5}$ cm.$^3$, which is considered to be a conventional size, the following dynamic resistances are obtained:

30 ohm at 0.2 volt
100 ohm at zero bias
10K ohm at —0.2 volt

Thus, the PbTe diode in accordance with the present invention is very attractive for various purposes. It will be readily apparent to those skilled in the art that such device can be used as an almost no loss rectifier; as a high sensitivity RF detector; or as a constant current source as will be apparent by reference to FIGURE 1, even with the application of an extremely high reverse bias voltage, the reverse current will remain constant.

The method for realizing the unique properties and attributes of the PbTe diode of the present invention is as follows: A wafer of the material PbTe is cut from a single crystal grown by the conventional Czochralski technique, which is a conventional melt growth process wherein a seed crystal is lowered into a melt contained in a crucible. The seed crystal is slowly withdrawn very carefully and precisely so as to produce an acceptor concentration, that is a p-type concentration, in the grown crystal in the range of $10^{17}$–$10^{18}$ acceptor/cm.$^3$. The above composition range is due to derivation from stoichiometric composition.

Figure 2:
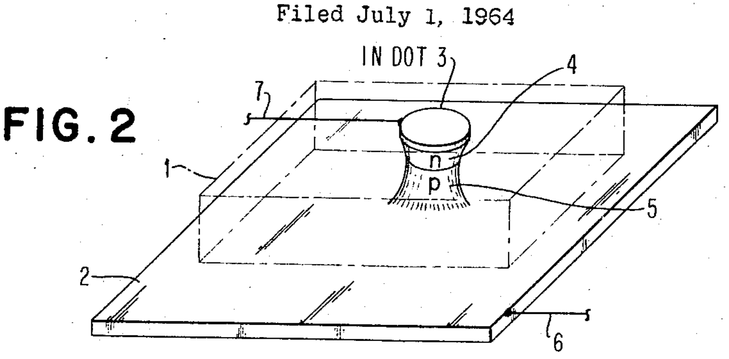
FIGURE 2 depicts the physical configuration of the PbTe diode in accordance with the present invention.

Having grown the single crystal, a wafer is then cut therefrom which is labeled 1 in FIGURE 2. This wafer 1 is soldered to a metal tab 2 which is electrically neutral in PbTe. The soldering is accomplished by means of a solder such as T1 which is p-type determining in PbTe. Examples of the tab material are Pt and Ni. Cu is specifically excluded since it is an example of a material which is not electrically neutral. The wafer 1 is then alloyed with a dot 3 of n-type determining material, such as In, for 10 to 20 seconds. This alloying is accomplished with a fast-rise, flat top, fast-fall temperature cycle at a temperature in the range 350–400° C. Upon cooling down, a region 4 of n conductivity type is recrystallized in the wafer 1.

It will thus be appreciated that the attainment of the desirable low acceptor concentration in the wafer and, concomitantly, selection of the proper conditions for alloying form the essential steps in the technique of fabricating the PbTe diode of the present invention. It should be noted that even lower temperatures for alloying can be used and are preferred; however, temperatures higher than 400° C. will not yield the desired electrical characteristics.

An acid etch resist is then applied around the dot 3 and etching of the wafer 1 is carried out to produce the final stalk-like configuration depicted in FIGURE 2 comprising the region 4 of n conductivity and region 5 of p conductivity type. The original dimensions of the wafer 1 have been chosen so that the finished diode has as short a stalk as possible in order that the device may be physically rugged. As is usual, leads 6 and 7 are affixed to the tab 2 and dot 3.

What has been disclosed is a unique PbTe diode comprising a pn junction, which, by virtue of judicious attainment of a suitable low acceptor concentration, by suitable selection of the conditions for alloying, results in a device having features and advantages allowing for efficient rectification characteristics at room temperature.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of fabricating a PbTe diode comprising the steps of:

forming a wafer of PbTe having an acceptor concentration of approximately $10^{17}$–$10^{18}$ carriers/cc., alloying a quantity of n-type determining material on said wafer at a temperature less than 400° C. so as to form a junction in said wafer.

2. A method of fabricating a PbTe diode operable at room temperature comprising the steps of:

providing a single crystal PbTe wafer having an acceptor concentration in the range of $10^{17}$–$10^{18}$ carriers/cc., alloying a layer of In to a first surface of said wafer at a temperature less than 400° C. so as to produce a pn junction therein, and attaching electrical conductors to the alloyed portion of said first surface and to an opposite surface of said wafer.

3. A method of fabricating a PbTe diode as claimed in claim 2 wherein said alloying is accomplished in the temperature range between 350° C. and 400° C. for a time period between 10 seconds and 20 seconds.

References Cited

UNITED STATES PATENTS

| | | | |
|---|---|---|---|
| 2,865,793 | 12/1958 | Nobel | 317—235 X |
| 2,865,794 | 12/1958 | Kroger et al. | 148—33 X |
| 2,956,912 | 10/1960 | Kroger et al. | 148—33 X |

OTHER REFERENCES

Journal of Applied Physics, volume 32, No. 10, 1961, relied on pages 2185–2194.

Solid State Physics, volume 9, 1959, Academic Press, relied on pages 94–98 and 102–106.

Thermoelectric Materials and Devices, Reinhold Pub. Corp., N.Y., 1960, relied on page 147.

CHARLES N. LOVELL, *Primary Examiner.*

DAVID L. RECK, *Examiner.*